United States Patent [19]

Pancholy

[11] 4,172,906
[45] Oct. 30, 1979

[54] METHOD FOR PASSIVATING III-V COMPOUND SEMICONDUCTORS

[75] Inventor: Ranjeet K. Pancholy, Mission Viejo, Calif.

[73] Assignee: Rockwell International Corporation, El Segundo, Calif.

[21] Appl. No.: 796,120

[22] Filed: May 11, 1977

[51] Int. Cl.² .............................................. B05D 5/12
[52] U.S. Cl. ..................................... 427/82; 156/605; 357/52; 427/38; 427/85; 427/87; 148/6.3; 148/1.5
[58] Field of Search ........................ 357/52; 156/605; 427/87, 82, 85, 38; 148/6.3, 1.5

[56] References Cited
PUBLICATIONS

B. Schwartz et al. "The Influence of Native Oxides on the Degradation and Passivation of GaAs Junction Lasers" 1972 Symp. on GaAs (1972).
Phillips et al. "Fabrication of GaAsP MIS Capacitors Using a Thermal-Oxidation Dielectric-Growth Process", J. Electrochem Soc., 8-1973.
Coerver et al. "Thermal Oxidation of Gallium Arsenide Phosphide" Doctoral Thesis, Univ. of New Mexico, 8-1973.
Phillips et al. "Gallium Arsenide Phosphide MIS Capacitor Fabrication" Doctoral Thesis, Univ. of New Mexico, 5-1972.

Primary Examiner—John D. Smith
Attorney, Agent, or Firm—H. Fredrick Hamann; G. Donald Weber, Jr.

[57] ABSTRACT

High quality native surface passivation dielectrics on Group III–Group V compound semiconductors are produced by thermal conversion of a surface layer having a specially provided composition. The electrical properties of these dielectrics meet the requirements for dielectric and passivation layers over semiconductor devices generally and in field effect devices in particular.

7 Claims, 7 Drawing Figures

METHOD FOR PASSIVATING III-V COMPOUND SEMICONDUCTORS

RELATED APPLICATION

An application entitled "Method and Device Structure for Reducing Surface Recombination Velocities in III-V Compound Semiconductors" by Pancholy, Kuhlmann, and Phillips bearing Ser. No. 796,118, filed on even date herewith discloses related subject matter and is incorporated herein by reference.

BACKGROUND OF THE INVENTION

1. Field of the Invention

The invention relates to the field of Group III–Group V compound semiconductor devices and more particularly to dielectric insulators and passivators for such devices.

2. Prior Art

High quality dielectric and surface passivation layers in intimate contact with the semiconductor surface are needed in modern semiconductor devices in order for such devices to achieve their full potential. In the absence of such dielectric layers the performance of devices is severely limited by large interface state densities, excessive surface recombination currents, excessive surface carrier generation and varying surface potentials.

The vast variety of silicon semiconductor devices presently available is in large part a result of the excellent surface passivation characteristics of thermally grown silicon dioxide which provides a stable uniform surface potential at the semiconductor-dielectric interface while minimizing detrimental surface effects such as surface carrier recombination and generation. Thermally grown silicon dioxide may be characterized as a native passivation layer because the silicon therein is derived from the surface of the silicon on which it is grown, rather than being externally supplied.

III-V compound semiconductors have material characteristics which are substantially superior to those of silicon for many device applications, including very high frequency devices and solar cells. However, this superiority cannot be fully exploited without high quality passivation dielectrics. Unfortunately, unlike silicon, III-V compound semiconductors, with the exception of gallium arsenide phosphide, when exposed to thermal oxidation conditions do not produce a satisfactory passivating dielectric.

Thermal oxidation has been successfully utilized to grow a native dielectric on the III-V semiconductor material—gallium arsenide phosphide (GaAsP). Thermal oxidation of GaAsP produces gallium-phosphate-oxide [gallium phosphate ($GaPO_4$) containing some gallium oxide ($Ga_2O_3$)].

Thermal oxidation is unsuccessful with most other III-V compounds because many III-V compound semiconductors decompose into their constituent elements at temperatures below those required for thermal oxidation. For example, gallium arsenide, (GaAs) decomposes into gallium and arsenic at about 700° C. in an oxidizing environment and evolves arsenic trioxide ($As_2O_3$) which is volatile at that temperature. Further, thermal oxidation of many III-V compound semiconductors produces a crystalline oxide. A crystalline dielectric does not make a good passivation layer for a semiconductor because the crystalline nature of the dielectric allows current conduction through the dielectric.

Because of its optical and electrical properties gallium arsenide is one of the most attractive III-V compound semiconductors for device applications. Thermal oxidation of gallium arsenide produces gallium oxide ($Ga_2O_3$) which is crystalline, rather than amorphous in character and consequently is an inadequate surface passivator. Anodic oxidation processes using room temperature wet chemical oxidation have been utilized to provide native dielectric layers on gallium arsenide (GaAs). However, the resulting dielectrics are bias and temperature sensitive and consequently are inadequate for many applications. Furthermore, the anodic oxides have been found to be chemically reactive with water ($H_2O$) thus limiting their application.

In consequence of the unavailability of adequate native dielectric surface passivators for most III-V compound semiconductors, including gallium arsenide, the art utilizes deposited dielectrics such as silicon dioxide ($SiO_2$) and silicon nitride ($Si_3N_4$) for passivation. However, these dielectrics prevent the resulting devices from achieving their full potential because of the higher interface state density and poor surface passivation which result in excessive carrier generation-recombination at the semiconductor-dielectric interface and yield variable surface potentials.

Formation of GaAsP by ion implantation of phosphorous into gallium arsenide has been reported in the literature.

A good surface passivator is needed which is of general applicability to III-V semiconductors.

SUMMARY OF THE INVENTION

The invention overcomes the passivation problems of the prior art by forming a native amorphous passivating dielectric layer on III-V semiconductors. This may be accomplished by thermally growing the native amorphous passivating dielectric layers by introduction of passivation layer nutrients of which the III-V compound is devoid into the surface of the crystal prior to thermal conversion of that surface, or by provision of an epitaxial layer of a III-V semiconductor containing those nutrients on the initial III-V compound prior to the thermal conversion of that surface layer.

DESCRIPTION OF THE PREFERRED EMBODIMENT

Figure 1A:
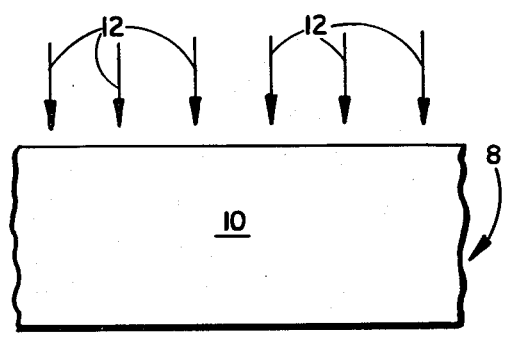
FIG. 1 illustrates the steps involved in a technique for producing a native passivating dielectric on a III-V compound semiconductor.

A high quality passivating layer in accordance with the invention is produced on a III-V compound semiconductor by (1) selecting at least one passivation layer nutrient which is absent from the compound or present in an amount which is insufficient to enable thermal conversion of the surface to form a high quality, amorphous, native, passivation layer, (2) introducing the selected nutrient(s) into the surface of the semiconductor crystal and (3) thermally converting the semiconductor surface to form an amorphous native dielectric which could not have been formed absent the added nutrient(s). The selected nutrient(s) may be introduced into the surface of the compound by any appropriate process, such as, ion implantation, sputtering, evaporation, molecular beam epitaxy, chemical vapor deposition, pyrolosis, liquid phase epitaxy, chemical diffusion or the like, so long as the process changes the composition of the crystal surface to render the composition suitable for growing the desired passivating layer through thermal conversion. The selected passivation layer nutrient(s) may be referred to as a passivation enabling nutrient(s).

The nutrient selected for addition to the semiconductor material should be either a Group III or a Group V element in order that the modified portion of the semiconductor will remain a III–V semiconductor compound and retain the same crystal structure as the unmodified portions of the semiconductor crystal and thereby avoid introducing interface states at the boundary between the two materials.

In selecting the nutrient to be added to the III–V semiconductor compound to enable the passivation layer to be produced by thermal conversion of the surface of the material, it needs to be recognized that some elements added to the material will increase the energy band gap of the material and others will decrease the energy band gap. Where the added nutrient increases the energy band gap of the material, failure to convert the entire depth of the modified layer to a dielectric will result in a slight potential barrier which tends to repel minority carriers and thereby reduce the effective surface recombination velocity in the semiconductor. However, if a nutrient is utilized which reduces the energy band gap of the semiconductor material and the full depth of the modified region is not converted to the dielectric, then the energy band gap would be lower adjacent the dielectric-semiconductor interface than it is deeper in the semiconductor material and minority carriers would be attracted to the dielectric-semiconductor interface. This would tend to increase the effective surface recombination velocity of the material. This effect is discussed in greater detail in the above-mentioned related application. Further, it is preferred that a nutrient be chosen which either does not reduce or reduces only slightly the mobility of electrons when added to the basic III–V compound. This is preferred in order that the operating characteristics of the device will not be deteriorated by the presence of the added nutrient within the semiconductor crystal near its surface in the event that the thermal conversion process does not convert the entire depth of the modified layer to a passivation dielectric. However, it will be recognized that such selections can not always be made, in which case one must make do with one of the available operative nutrients even if the selected one reduces both the electron mobility and the energy band gap.

Ion implantation of the nutrient(s) is the preferred method of adding the nutrient(s) to the surface region of the crystal because of the ability of ion implantation to control the quantity of each nutrient added, the depths to which nutrient(s) penetrate the crystal and the distribution profile of the nutrient(s) within the surface layer of the semiconductor. However, ion implantation of the nutrient(s) can disrupt the crystal structure of the III–V compound semiconductor. If the implantation is done with the crystal at room temperature, the implantation may effectively destroy the crystal structure of the surface of the crystal. However, if the implantation is carried out with the crystal at a temperature in the range of 420°–500° C. (or possibly hotter) the implantation may directly produce the desired monocrystalline modified III–V compound layer which includes the added nutrient.

In the event that the method of nutrient addition destroys the surface of the crystal, the quality of the passivating dielectric layer is maximized by recrystalizing the surface of the crystal prior to thermally converting that surface to a dielectric. Several techniques can be utilized for recrystalizing the semiconductor material and which one is preferable may depend on the particular III–V compound and nutrient involved. Recrystalization can be performed in a vacuum at a temperature at which the nutrient and III–V compound components are non-volatile or under a sufficient vapor pressure of the nutrient and III–V compound components to prevent excessive sublimation of those materials. Alternatively, a capping layer such as silicon nitride ($Si_3N_4$) may be deposited over the surface of the crystal to be recrystalized in order to prevent loss of material from that surface via evaporation, sublimation and decomposition during the recrystalization process at atmospheric pressure. In any event, the semiconductor is annealed at a high temperature in order to remove damage to the crystal structure and in order to reconstitute the crystal as a compound including the added nutrient. This is preferably achieved by recrystalizing the material in a manner in which the crystal structure of the undisturbed III–V compound propagates from that crystal out through the layer being recrystalized. In the event that a capping layer such as silicon nitride is utilized to prevent loss of material during the recrystalizing of III–V compound, that capping layer is removed after recrystalization is complete.

If the crystal structure of the III–V compound is not destroyed by the addition of the nutrients or following recrystalization if it is destroyed, the nutrient containing crystal surface is exposed to a thermal conversion process in which the nutrient containing surface of the crystal is converted to an amorphous, electrically insulating, passivating dielectric material which remains in intimate contact with the semiconductor crystal. This thermal conversion process involves externally supplying an additional component element of the passivation dielectric during the thermal conversion. This additional element is generally transported by a stream of an inert carrier gas. The thermal conversion process often produces gaseous reaction products. Any gaseous reaction products are carried away from the wafer surface by the carrier gas stream. The thermal conversion process will generally be one of oxidation in which the externally supplied element is oxygen. However, this is a function of the dielectric desired.

The final result of this process is a semiconductor having an amorphous, native, thermally produced, dielectric layer disposed thereon. The native nature of the dielectric maximizes the intimate contact between the insulator and the underlying semiconductor and yields excellent adherence of the passivating film to the semiconductor.

The steps involved in this process are illustrated schematically in FIG. 1. Step one is illustrated in FIG. 1a where a wafer 8 of a III–V compound semiconductor 10 is exposed to ion implantation of the selected added nutrient as illustrated by the arrows 12. In FIG. 1b the resulting wafer 8 is illustrated and has a layer 14 along the upper surface of material 10 which is enriched with the added nutrient. The layer 14 will generally be amorphous as a result of high implantation densities which effectively destroy the crystal structure within the implanted layer. In step two wafer 8 is annealed at high temperature to recrystalize the layer 14 to form a continuous crystal structure with the unmodified material 10 of wafer 8. As illustrated in FIG. 1c at the end of step two the layer 14 has been recrystalized as layer 16. In step three, illustrated in FIG. 1d, the recrystalized layer 16 is thermally converted to amorphous dielectric 18. In the illustrated example the thermal conversion is via an oxidation process in which oxygen reacts with the material of layer 14 to form the amorphous native dielectric 18. The final wafer is illustrated in FIG. 1e where the increased volume of the amorphous dielectric 18 over the volume of the crystalline layer 16 is illustrated.

When the compound semiconductor is gallium arsenide, the added nutrient is preferably phosphorous which may preferably be introduced by ion implantation. The resulting passivating layer is mainly gallium phosphate ($GaPO_4$) and may include some quantities of gallium oxide ($Ga_2O_3$). This passivation layer may be referred to as gallium phosphate oxide (GPO) and is amorphous and intimately and highly adherent to the underlying gallium arsenide. Gallium phosphate oxide is a good amorphous passivator which renders the underlying semiconductor immune from chemical contamination while simultaneously providing the exceedingly low interface state densities and surface recombination velocities needed for high quality semiconductor devices. The gallium phosphate oxide has the further advantage that its volume is greater than the volume of the gallium arsenide phosphide crystal which is thermally converted to form the gallium phosphate oxide even though some of the constituents of the original crystal are removed as gaseous reaction products. This aids in the prevention of pin holes in the passivating layer because the volume expansion tends to reduce the diameter of any pin holes in the dielectric as the layer grows.

The dielectric strength of the dielectric is at least in part a function of the relative concentrations of gallium phosphate and gallium oxide in the dielectric. A gallium oxide molar concentration of less than 40% is preferred in order to assure that any gallium oxide crystalites are small and embedded in amorphous components of the dielectric. As the molar concentration of the crystalline gallium oxide increases relative to amorphous components of the dielectric, the passivation characteristics of the dielectric deteriorate. On the basis of probable gallium oxide crystalite sizes and the embedding characteristics of the amorphous components of the dielectric, it is considered highly desirable that the gallium oxide molar concentration be less than 80%. The composition $GaAs_{1-x}P_x$ of the modified layer prior to thermal conversion preferably has $x \geq 0.4$, although values as low as 0.2 are expected to yield passivation improvements over the prior art. In the case of a base semiconductor compound of InP and InAs where the added nutrient is aluminum, similar conditions apply.

Where the III-V compound is indium arsenide (InAs) the added nutrient is preferably phosphorous and the passivation layer is preferably indium phosphate oxide (IPO). In most other III-V compounds it is preferable to utilize aluminum as the added nutrient. Where aluminum is present in the semiconductor, the passivation layer may comprise amorphous aluminum oxide. In those materials in which both aluminum and phosphorous are present at the time of thermal conversion, a combination of aluminum phosphate and aluminum oxide may comprise the dielectric layer.

The passivation layer formed in accordance with the present invention is useful as a diffusion mask for restricting impurity diffusion to selected locations not protected by the dielectric. In those situations where the dielectric layer will be utilized for masking purposes only and then removed, the surface state density at the semiconductor-dielectric interface is unimportant. Consequently, thermal conversion of the modified surface layer to the dielectric need not be preceded by a recrystalization step even where the crystal structure of the surface of the semiconductor has been destroyed during the addition of the added nutrient. Where the dielectric layer is to be utilized for passivation and a low surface density is important, it is desirable to have at least the region of the modified layer which is adjacent to the unmodified region of the semiconductor in a substantially monocrystaline form prior to its conversion in order to minimize the surface state density at the semiconductor-insulator interface. This is preferably achieved by a recrystalization step in which the entire modified portion of the semiconductor is recrystalized prior to thermal conversion of the modified layer. However, this may also be accomplished without the recrystalization step if the thermal conversion process is carried out under conditions in which the portions of the modified layer adjacent the unmodified semiconductor recrystalize during the thermal conversion process prior to the thermal conversion reactions reaching that depth in the material.

EXAMPLE

A gallium arsenide (GaAs) crystal was implanted with phosphorus ions at an ion implantation of energy of 30 Kev with a dosage of $5.5 \times 10^{16}$ phosphorous atoms per square centimeter corresponding to conversion of the surface to $GaAs_{0.66}P_{0.33}$. This step is preferably performed with the wafer at a temperature above 150° C. in order to minimize crystal damage resulting from the ion implantation. This implantation energy results in phosphorous ion implantation to a mean range of 0.0248 microns and standard deviation 0.0158 microns into the gallium arsenide according to LSS theory. The high implantation dose substantially destroys the crystal structure of the surface layer. Consequently, the crystal was recrystalized at a temperature of 800° C. in a vacuum ampoule for a period of one hour to convert the surface layer to a III-V crystal structure having the formula $GaAs_{1-x}P$ where $x \leq 0.33$. Following the anneal the crystal was allowed to cool to room temperature and removed from the vacuum chamber.

The thermal oxidation process is preferably carried out at approximately 700° C. using dry oxygen as the oxygen source and atmospheric pressure. Under these conditions, during the thermal oxidation process, the oxygen combines with the gallium arsenide phosphide to form gallium phosphate ($GaPO_4$), gallium oxide ($Ga_2O_3$), arsenic trioxide ($As_2O_3$) and possibly phosphorous pentoxide ($P_2O_5$) and gallium arsenate ($GaAsO_4$). Both $As_2O_5$ and $P_2O_5$ are gaseous at the reaction temperature and are swept from the reaction chamber by the carrier gas. $GaPO_4$, $Ga_2O_3$ and $GaAsO_4$ are solids at the reaction temperature and remain in contact with the wafer as a passivating dielectric. It is believed that the dielectric is mostly $GaPO_4$ with some $Ga_2O_3$ therein with at most minor amounts of $GaAsO_4$ present. The quantity of $GaPO_4$ (which is amorphous) is sufficient to assure that the dielectric acts amorphous. This dielectric layer exhibited a satisfactory interface state density which is a substantial improvement in the gallium arsenide passivation art.

The exact chemical reactions involved in the conversion of the GaAsP to GPO are not known. However, in the case where the GaAsP is $GaAs_{0.5}P_{0.5}$, the equation for the overall reaction is believed to be:

$$28GaAs_{0.5}P_{0.5} + 49O_2 \xrightarrow{700°\ C} 12GaPO_4 + 8Ga_2O_3 + P_2O_5 \uparrow + 7As_2O_3 \uparrow$$

With differing initial $GaAs_{1-x}P_x$ compositions the overall equation will be different.

As an alternative to modifying the composition of the surface region of the semiconductor by adding nutrients to that region, an additional layer including the added nutrient may be epitaxially grown on the surface of the semiconductor. In this method, as in the preferred method, the passivating material is formed by thermal conversion of the surface, nutrient containing, region of the semiconductor. In accordance with this embodiment the monocrystalline, nutrient containing layer is formed at the surface of a semiconductor crystal by epitaxial growth. This growth may preferably be by molecular beam epitaxy. In this method, the component molecules of the nutrient containing compound are brought into contact with each other at the semiconductor surface where they react to form the "modified" region.

Figure 2A:
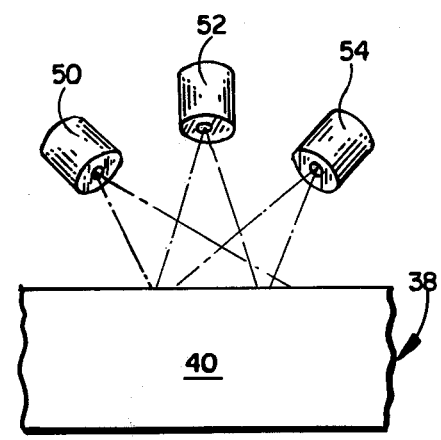
FIG. 2 illustrates the steps involved in molecular beam epitaxial method of producing on the surface of the semiconductor a layer of III-V compound containing passivation nutrients.
Figure 1B:
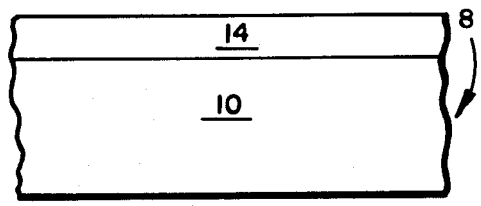
Figure 2B:
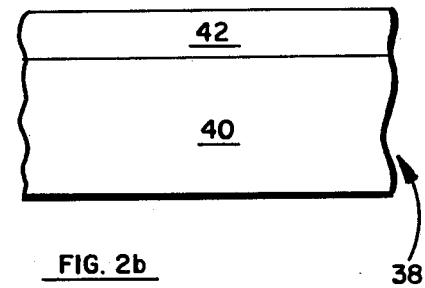
Figure 1C:
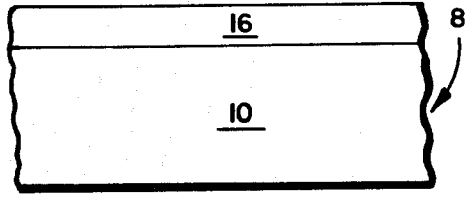
Figure 1D:
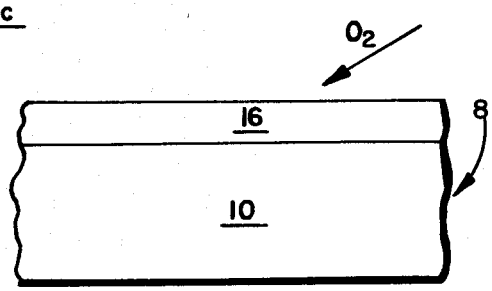
Figure 1E:
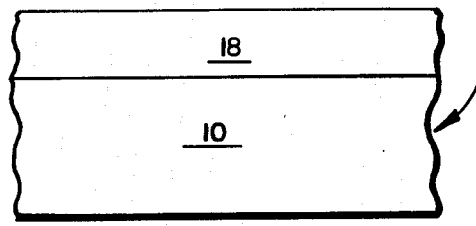

The molecular beam epitaxy of the modified region is preferably carried out with the wafer at a temperature in the range from 23° C. to 700° C. in order to initiate the formation of a high quality crystaline layer. To form a selected III-V compound semiconductor, individual elements contained in the desired compound are preferably introduced as molecular beams whose intensity will yield the desired compound. These beams merge at the surface of the wafer and react to form the desired compound. If the desired compound is GaAsP, then three beams are utilized, one of gallium, one of arsenic and one of phosphorous which react to form gallium arsenide phosphide directly on the wafer. The process of forming of the nutrient containing layer by molecular beam epitaxy is illustrated schematically in FIG. 2. In (2a) a wafer 38 of a III-V compound semiconductor material 40 is exposed to incident beams of appropriate molecules generated by effusion cells 50, 52 and 54. The molecules of the beams strike and adhere to the surface of the wafer 40 and react there to form a monocrystalline modified layer 42 on the wafer 40. The wafer at the end of this step is illustrated in FIG. 2b and is equivalent to wafer 8 following the recrystalization step of the preferred process. The wafer is then subjected to the conversion process of step 3 of FIG. 1d.

While the discussion of the preferred embodiment has been in terms of adding a passivation enabling nutrient to a compound which is devoid thereof, it will be recognized that the present invention is also applicable to situations in which the nutrient is already present, but in insufficient concentration to yield satisfactory passivation. Consequently, for purposes of this invention a passivation enabling nutrient may be broadly defined as any element from Group III or Group V whose addition to the surface layer of the semiconductor enables thermal conversion of that layer to form a dielectric to provide improved passivation over that which would result from the thermal conversion in the absence of the added element.

Although the main utility of the passivation technique of the invention is presently seen as being in its use with monocrystalline semiconductors for semiconductor device passivation, the technique is also applicable to polycrystalline III-V compound semiconductor structures and devices.

A high quality native passivation dielectric for III-V compound has been disclosed. It will be understood, that the method of the invention is of general applicability and the protection afforded the method is limited only by the appended claims.

What is claimed is:

1. A method of making a semiconductor by growing a native passivation dielectric on the surface of a III-V semiconductor compound comprising:
   providing a wafer of III-V semiconductor compound having uniform composition,
   selecting a passivation enabling element from the III-V materials which will enable said compound to be converted to a dielectric;
   forming a surface layer at said compound by ion implantation to form an increased concentration of said selected element over the concentration in another region of said III-V semiconductor compound; and
   converting all of said surface layer to a native dielectric which could not have been formed from said III-V semiconductor compound by that conversion process absent the increased concentration of said selected element.

2. The method recited in claim 1 wherein said conversion process comprises thermal oxidation of said surface to form an oxygen containing compound.

3. The method recited in claim 1 wherein said compound is gallium arsenide, said selected at least one element is phosphorous and said conversion process comprises thermal oxidation and the molar composition of said passivating dielectric is at least 50% gallium phosphate.

4. The method recited in claim 1 wherein
   said surface layer is formed as an integral part of said wafer.

5. The method recited in claim 1 wherein said semiconductor compound is monocrystalline and said forming step further comprises recrystalizing said surface layer to form a continuous monocrystalline crystal with the remainder of said compound.

6. The method recited in claim 5 wherein
   said forming step comprises adding a nutrient element to change the chemical composition of said wafer in the vicinity of said one surface.

7. The method recited in claim 5 wherein
   said wafer comprises GaAs,
   said surface layer is formed by combining phosphorous with said GaAs to form GaAsP, and
   said dielectric is formed by thermally oxidizing all of said surface layer of GaAsP to form GPO (Gallium-Phosphate-Oxide).

* * * * *